US010637405B2

(12) United States Patent
Roiz et al.

(10) Patent No.: US 10,637,405 B2
(45) Date of Patent: Apr. 28, 2020

(54) WIDEBAND BIASING OF HIGH POWER AMPLIFIERS

(71) Applicant: NXP USA, Inc., Austin, TX (US)

(72) Inventors: Arturo Roiz, Tempe, AZ (US); Justin Nelson Annes, Chandler, AZ (US); Terry L. Thomas, Chandler, TX (US)

(73) Assignee: NXP USA, Inc., Austin, TX (US)

( * ) Notice: Subject to any disclaimer, the term of this patent is extended or adjusted under 35 U.S.C. 154(b) by 0 days.

(21) Appl. No.: 16/103,735

(22) Filed: Aug. 14, 2018

(65) Prior Publication Data

US 2020/0059201 A1 Feb. 20, 2020

(51) Int. Cl.
| | | |
|---|---|---|
| H03F 3/191 | (2006.01) | |
| H03F 1/02 | (2006.01) | |
| H03F 3/195 | (2006.01) | |
| H05K 1/16 | (2006.01) | |
| H05K 1/02 | (2006.01) | |
| H03F 3/213 | (2006.01) | |

(52) U.S. Cl.
CPC ........... H03F 1/0288 (2013.01); H03F 3/195 (2013.01); H03F 3/213 (2013.01); H05K 1/0243 (2013.01); H05K 1/165 (2013.01); H03F 2200/108 (2013.01); H03F 2200/267 (2013.01); H03F 2200/301 (2013.01); H03F 2200/309 (2013.01); H03F 2200/423 (2013.01); H03F 2200/451 (2013.01); H05K 2201/10166 (2013.01)

(58) Field of Classification Search
CPC ............. H03F 3/191; H03F 3/193; H03F 3/60
USPC .......................................... 330/66, 302, 286
See application file for complete search history.

(56) References Cited

U.S. PATENT DOCUMENTS

| 5,347,229 A | * | 9/1994 | Suckling | ................... H03F 1/32 |
| | | | | 330/251 |
| 6,111,459 A | * | 8/2000 | Nishijima | ............... H03F 3/602 |
| | | | | 330/124 D |
| 8,299,856 B2 | | 10/2012 | Blair | |
| 9,106,187 B2 | | 8/2015 | Ladhani et al. | |
| | | | (Continued) | |

FOREIGN PATENT DOCUMENTS

WO 2009139680 A1 11/2009

OTHER PUBLICATIONS

Zhu et al.; "An Integrated RF Match and Baseband Termination Supporting 395 MHz Instantaneous Bandwidth for High Power Amplifier Applications"; 2017 IEEE MTT-S International Microwave Symposium (IMS); Jun. 4-9, 2017; 4 pages.

*Primary Examiner* — Steven J Mottola

(57) ABSTRACT

A radio frequency (RF) amplifier circuit includes an amplifier device and a first baseband bias circuit. The amplifier device includes a first input configured to receive a first signal to be amplified and a first output configured to output a first amplified signal. The first baseband bias circuit includes an input coupled to the first output of the amplifier device. The first baseband bias circuit includes a first envelope decoupling circuit and a first harmonic decoupling circuit. The first envelope decoupling circuit includes a first bulk capacitor and a first distributed inductor configured to resonate in a baseband frequency range. The first harmonic decoupling circuit includes a second bulk capacitor and a second distributed inductor configured to resonate at a harmonic frequency of the frequency of the first signal received at the input of the amplifier device.

20 Claims, 7 Drawing Sheets

(56) References Cited

U.S. PATENT DOCUMENTS

2011/0163814 A1\* 7/2011 Hellberg ............... H03F 1/0205
  330/302

\* cited by examiner

WIDEBAND BIASING OF HIGH POWER AMPLIFIERS

FIELD OF THE DISCLOSURE

The present disclosure relates generally to radio frequency (RF) circuits, and more particularly to RF amplifiers that include signal and bias lines on a circuit substrate.

BACKGROUND OF THE DISCLOSURE

RF amplifiers typically include bias circuitry configured to provide direct current (DC) bias voltages to the amplifier transistor(s). To ensure that a significant amount of RF power is not lost through the bias circuitry, it is important to de-couple or isolate the RF circuitry from the DC bias circuitry. Conventional high power amplifiers such as those utilized for telecommunication purposes, including for example Doherty power amplifiers, often have bias line implementations so as to achieve increased baseband equivalence resonance. Such implementations can, for example, involve the use of dual symmetrical bias lines (or feeds) that achieve only an increased baseband equivalent resonance by a factor of the square root of two. Such an increase can arise from the parallel combination of both bias line equivalent circuits (assuming both lines are symmetrical and have the same dimensions). This in turn will only reduce (by half) the equivalent inductance (e.g., in nano Henries (nH)) from the bias lines presented at the package reference plane.

For at least these reasons, therefore, it would be advantageous if one or more improved circuits, systems and methods for achieving enhanced baseband resonance, and/or one or more other advantages, could be developed.

DETAILED DESCRIPTION

The present disclosure encompasses a variety of embodiments of circuits and systems in which the bandwidth of bias lines for high power amplifiers, including Doherty amplifiers, may be increased. The improvements may include increasing the functional frequency response of the bias circuit over a wideband frequency range and providing biasing over both baseband and harmonic frequencies. In at least some such embodiments, the frequency response is widened by reducing the equivalent inductance of bias lines or circuits across a functional frequency band, resulting in a higher baseband resonance capable of operating over a wider band of signals, and an improvement in linearity of amplifier performance. Further, electrical stresses on components, such as baseband decoupling capacitors, resulting from transitory peak voltages may be reduced by distributing the voltage across the baseband bias circuits described herein. Further, the disclosed embodiments may be incorporated in-line with bias circuits allowing for a compact PCB design.

Figure 1:
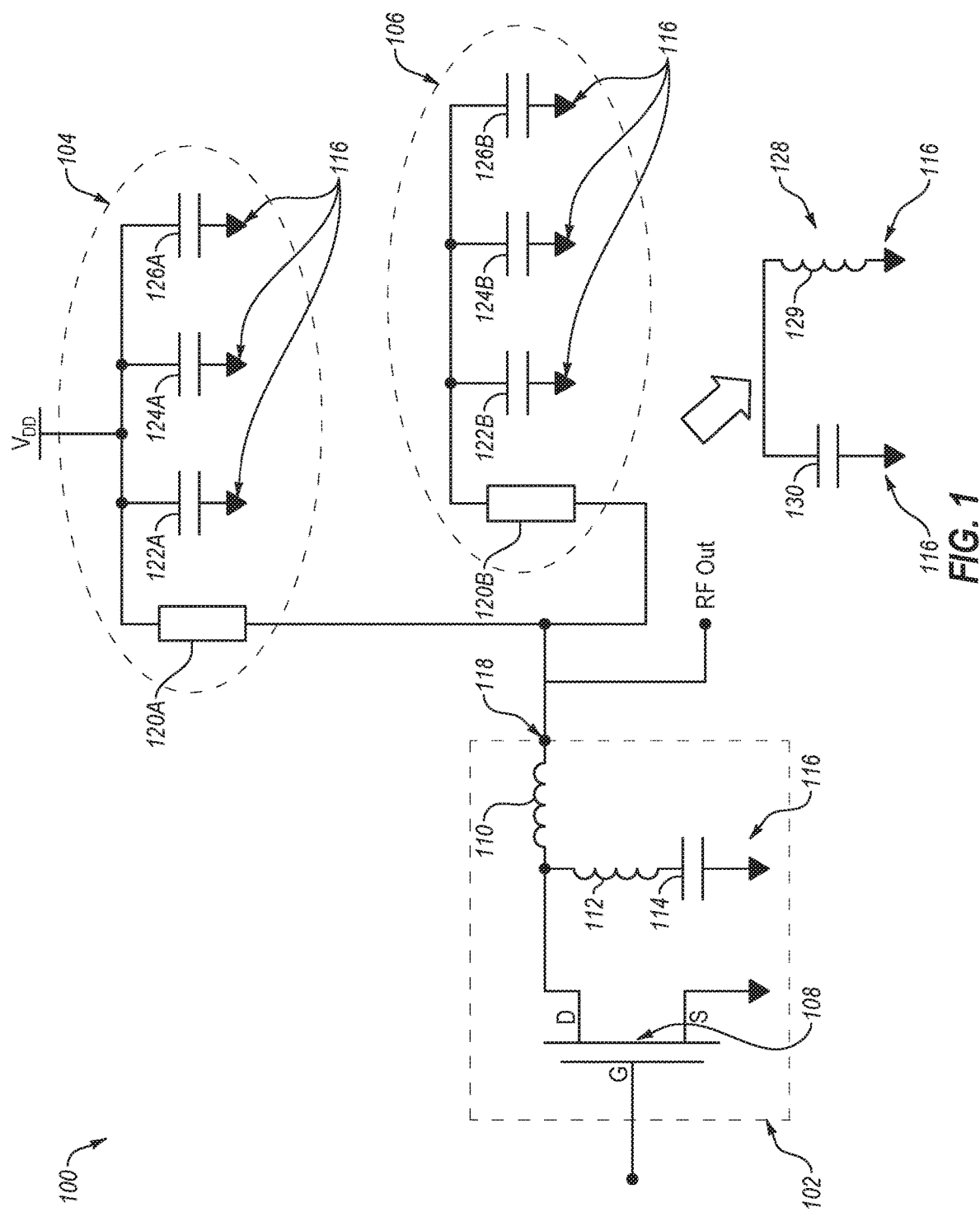
FIG. 1 is a schematic diagram illustrating baseband biasing in a biased amplifier circuit.

FIG. 1 shows a biased amplifier circuit 100 intended to illustrate an example high power amplifier (or package) 102 coupled to first and second bias lines 104 and 106, respectively. As shown, the high power amplifier 102 includes a power transistor 108 that in the present example may be a Field Effect Transistor (FET), such as but not limited to a Laterally Diffused Metal Oxide Semiconductor (LDMOS) FET having a gate (G) (control terminal), a drain (D) (first current conducting terminal), and a source (S) (second current conducting terminal). The gate of the power transistor 108 is coupled to an input port, which is configured to receive a relatively low-power RF signal to be amplified by the power transistor 108. The amplified RF signal is produced at output port 118, which in turn is coupled to an RF Out node. The RF Out node may be coupled through additional circuit elements (not illustrated) to a load (e.g., an antenna, not illustrated).

The drain is coupled to each of a first inductor 110 and a second inductor 112. The second inductor 112 is coupled in series between the drain of the power transistor 108 and a capacitor 114, and the capacitor 114 is coupled in series between the second inductor 112 and an additional port 116, which may be ground. The capacitance value of capacitor 114 may be selected to provide a virtual ground reference voltage for RF electrical signals, such that inductor 112 functions as a shunt inductance to the RF ground voltage, while the inductance of the second inductor 112 is chosen to provide desired impedance at the drain at the fundamental frequency of the amplifier circuit 100. The first inductor 110 may be coupled between the drain of the power transistor 108 and an output port 118 of the high power amplifier 102. In various embodiments, an output circuit including inductors 110, 112 and capacitor 114 in the illustrated configuration or in modified configurations may operate as a high pass filter circuit, as a low pass filter circuit or as a bandpass filter circuit.

As for the first and second bias lines 104, 106, each of those bias lines includes a respective transmission line 120A, B and a respective set of first, second, and third capacitors 122A, B, 124A, B, and 126A, B. The respective transmission line 120A, B of each of the bias lines 104, 106 is coupled between the output port 118 of the high power amplifier 102 and each of the three capacitors 122A, B, 124A, B, and 126A, B of the respective bias line. All three of the respective capacitors 122A, B, 124A, B, and 126A, B of each respective bias lines 104, 106 are coupled in parallel with one another between the respective transmission line 120A, B and another port, which can be the additional port 116 (and may be ground). Further as illustrated, each of the bias lines 104, 106 may be represented by a small signal equivalent circuit 128 including an inductor 129 and a capacitor 130 coupled in series with one another (e.g., between two ends of the equivalent circuit that are each tied to the additional port 116 and can be grounded).

Given such an arrangement, it should be appreciated that a first resonant frequency $f_{R1}$ of the first bias line 104 and a second resonant frequency $f_{R2}$ of the second bias line 106 can be represented, respectively, by the following Equation (1) and Equation (2):

$$f_{R1}=1/(2\pi(L_{tot}C_{tot})^{1/2}) \qquad (1)$$

$$f_{R2}=1/(2\pi(L_{tot}C_{tot})^{1/2}) \qquad (2)$$

where $L_{tot}$ may be defined by the equivalent distributive inductance of the RF transmission line 120A,B with a range, for example, centered of around 5 nH, and $C_{tot}$ may be defined by the device (e.g., power amplifier) total shunt capacitance 114 presented between the drain and source terminals with a range, for example, of between 20 pF and 50 pF). Given this to be the case, the overall increase in the baseband equivalent resonance that arises from the combination of the first and second bias lines 104, 106 can be determined as the first resonant frequency $f_{R1}$ divided by the second resonant frequency $f_{R2}$, which as shown by the following Equation (3) has a value of the square root of two.

$$\frac{f_{r_1}=\frac{1}{2\pi\sqrt{L_{tot}C_{tot}}}}{f_{r_2}=\frac{1}{2\pi\sqrt{\frac{L_{tot}}{2}C_{tot}}}}=\frac{f_{r_1}}{f_{r_2}}=\sqrt{2} \qquad (3)$$

The above-mentioned approach may theoretically result in an improvement in the baseband equivalent resonance by a factor of the square root of two. Further, the biasing illustrated in FIG. 1 results in an equivalent baseband resonance in the range of approximately 160 MHz (Megahertz) which may be sufficient for some wideband standards. Other standards such as multiband or 5G LTE (5$^{th}$ generation Long Term Evolution) wideband standards require a wider band on the order of 200 to 400 MHz (or even beyond), and may require higher power levels and current levels. Further, carrier harmonics may also mandate wider band solutions that suppress harmonics that appear in the desired band.

Figure 2:
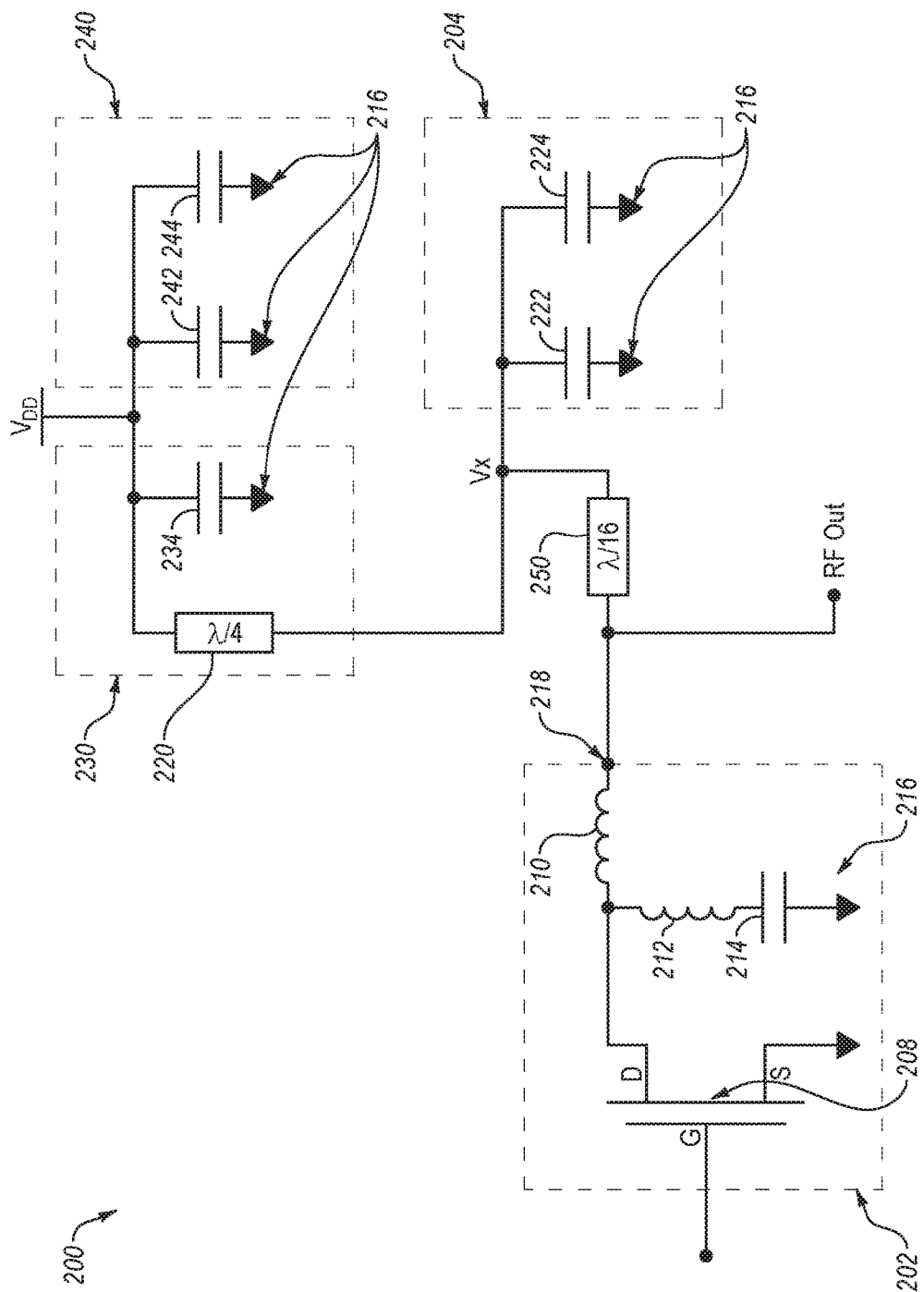
FIG. 2 is a schematic diagram illustrating a biased amplifier circuit including baseband and RF biasing of an amplifier device.

Referring to FIG. 2, a schematic diagram is provided to illustrate a biased amplifier circuit 200 that includes a high power amplifier 202, a baseband bias circuit 204, an RF decoupling circuit 230, and a bulk capacitor circuit 240.

The high power amplifier 202 includes a power transistor 208 that in the present example may be a FET, such as but not limited to an LDMOS FET having a gate (G), a source (S), and a drain (D). The gate of the power transistor 208 is coupled to an input port, which is configured to receive a relatively low-power RF signal to be amplified by the power transistor 208. The amplified RF signal is produced at output port 218, which in turn is coupled to an RF Out node. The RF Out node may be coupled through additional circuit elements (not illustrated) to a load (e.g., an antenna, not illustrated).

The drain is coupled to each of a first inductor 210 and a second inductor 212. The second inductor 212 is coupled in series between the drain of the power transistor 208 and a capacitor 214, and the capacitor 214 is coupled in series between the second inductor 212 and an additional port 216, which may be ground. The capacitance value of capacitor 214 may be selected to provide a virtual ground reference voltage for RF electrical signals, such that inductor 212 functions as a shunt inductance to the RF ground voltage, while the inductance of the second inductor 212 is chosen to provide desired impedance at the drain at the fundamental frequency of the amplifier circuit 200. The first inductor 210 may be coupled between the drain of the power transistor 208 and an output port 218 of the high power amplifier 202. In various embodiments, an output circuit including inductors 210, 212 and capacitor 214 in the illustrated configuration or in modified configurations may operate as a high pass filter circuit, as a low pass filter circuit or as a bandpass filter circuit.

The RF decoupling circuit 230 and the baseband bias circuit 204 may be coupled to node $V_X$ that may be further coupled to the high power amplifier 202 by way of a transmission line 250 exhibiting, for example, about a one-sixteenth wavelength ($\lambda/16$) phase shift. The RF decoupling circuit 230 may include a transmission line 220 exhibiting, for example, about a one-quarter wavelength ($\lambda/4$) phase shift. The RF decoupling circuit 230 may further include an RF decoupling capacitor 234 coupled between the transmission line 220 and an additional port 216, which may be ground. The RF decoupling capacitor 234 may be sized to decouple the carrier frequency presented at the drain of the power transistor 208 from the power supply $V_{DD}$. The RF decoupling capacitor 234 may be a discrete capacitor (e.g., a "chip capacitor") or may be a distributed capacitor. The bulk capacitor circuit 240 may include a first bulk capacitor 242 and a second bulk capacitor 244 for providing localized current sourcing from the power supply $V_{DD}$.

The baseband bias circuit 204 couples to the node $V_X$ and receives the bias current through the transmission line 220. The baseband bias circuit 204 may include a first baseband decoupling capacitor 222 and a second baseband decoupling capacitor 224, each respectively coupled between the node $V_X$ and additional port 216, which may be ground. While two baseband decoupling capacitors are illustrated, more than two baseband decoupling capacitors is also contemplated. Further, the baseband decoupling capacitors may be configured as discrete capacitor components, or may be implemented as distributed capacitors formed as part of a printed circuit, such as part of a printed circuit or wiring board and may also include silicon capacitors.

Particularly, the baseband decoupling capacitors 222, 224 may couple to respective bias lines, which may be transmission lines as can respectively be provided by way of respective traces on a PCB. In the present embodiment, each of the capacitors 214, 222, 224, 234, 242, and 244 shown in FIG. 2 is intended to be representative of a discrete capacitor rather than a distributed capacitance, although in other embodiments distributed capacitance(s) can additionally (or instead) be present for any of the specific capacitors. Additionally, it should further be appreciated that FIG. 2 is intended to be representative of a variety of embodiments of bias lines having a variety of different components and characteristics. In some embodiments encompassed herein, two or more of the bias lines may be different from one another and have one or more components that differ among the different bias lines.

The baseband decoupling capacitors may be selected to have relatively-large values ranging in tens or hundreds of nano-farads up to tens or hundreds of microfarads (µF), and may be used to provide a consistent impedance profile across a frequency band of choice. Further, the baseband decoupling capacitors may exhibit high impedance at RF frequencies (i.e., little or no loading effects) and may behave as a low impedance element at baseband frequencies (e.g., <200 MHz). The low impedance exhibited for low frequencies results in the shunting of the baseband bias circuit. When the baseband decoupling capacitors are attached to the drain terminal of the power transistor, the overall bias line inductance may reduce by half, and an $\sqrt{2}$ improvement factor of baseband resonance may be presented.

In operational applications, the baseband decoupling capacitors' resitive, and inductive parasitics (i.e., resistance (R), and inductance (L)) may prevent the baseband decoupling capacitors from achieving the desired high open impedance condition (desired at RF bands) and the baseband decoupling capacitors may start to impact RF performance. However, some parasitic resistance provides a desirable dampening effect. Therefore, the parasitics should be included in the design for determining optimal circuit performance. Accordingly, the biased amplifier circuit 200 may further include a transmission line 250 coupled between the output of the high power amplifier 202 and the node $V_X$. The transmission line 250 provides a back-off of the baseband decoupling capacitors 222 and 224 of the baseband bias circuit 204 from the drain terminal of the power transistor 208. In one embodiment, the transmission line 250 is configured to have a minimum phase shift of about one-sixteenth of a wavelength ($\lambda/16$), where the baseband bias circuit impedance increases (due to normal wave phase/impedance rotation) and may be safely shunted by the baseband decoupling capacitors 222 and 224.

Accordingly, a single baseband decoupling capacitor may reduce, at most, the total baseband bias circuit inductance by a factor of ~0.75. An improvement to this factor may provide improved wideband performance. To even further improve this factor, multiple different baseband resonances may be created by selecting different capacitance values for each of the baseband decoupling capacitors 222 and 224, resulting in a wideband termination. Such a wideband termination may recover the baseband resonance to a factor of about $\sqrt{2}$ and may reduce resonance magnitude by a factor ~0.5. Therefore, the baseband decoupling capacitors 222 and 224 may improve linearity of the biased amplifier circuit 200 resulting in an improved digital predistortion (DPD) linearization. The transmission line 220 provides a "back-off" of the RF decoupling capacitor 234 of the RF decoupling circuit 230 from the drain terminal of the power transistor 208. In one embodiment, the transmission line 220 may be configured to have a minimum phase shift of about one-quarter of a wavelength ($\lambda/4$), otherwise, if the minimum phase shift is significantly less than one-quarter of a wavelength ($\lambda/4$), then an RF impedance loading effect may be caused on the amplifier and, when combined with baseband decoupling capacitors, may substantially degrade RF performance (i.e., reduction in gain and efficiency).

In one example embodiment corresponding to FIG. 2, the first capacitor 222 may be sized to decouple the envelope of the base band signal. For example, the first capacitor 222 may have a capacitance value between about 2 μF and about 10 μF (e.g., on the order of about 4.7 μF) for suppressing baseband signals in a range of about 100 MHz to about 200 MHz (e.g., on the order of about 160 MHz). Further, the second capacitor 224 may be sized to further enhance the baseband suppression results from first baseband decoupling capacitor C222. For example, second capacitor 224 may have a capacitance value of a range, for example, of between 2 μF and 10 μF. Notwithstanding this example, the present disclosure is intended to encompass numerous other embodiments in which any of these capacitors may have other capacitance values.

Figure 3:
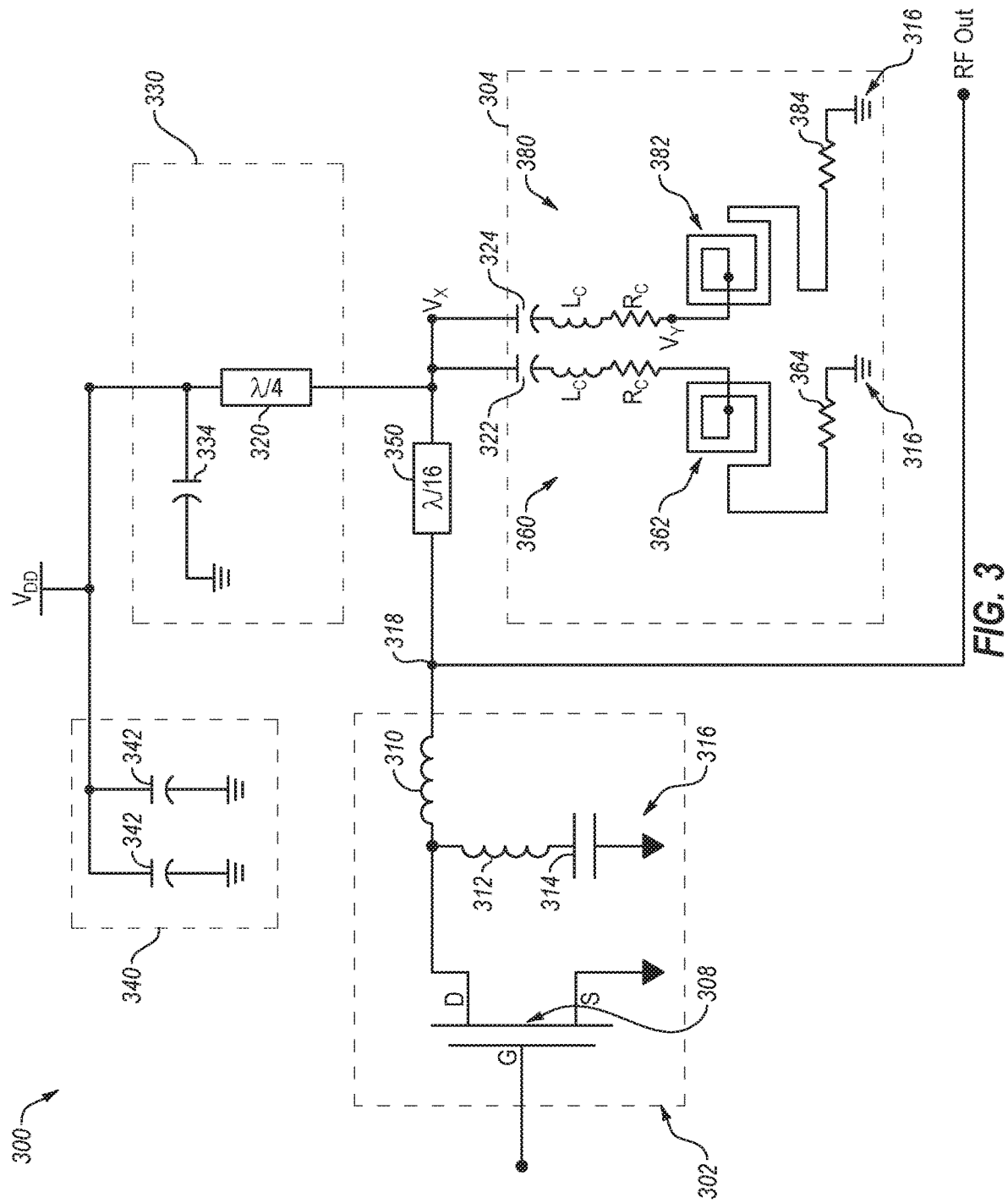
FIG. 3 is a schematic diagram illustrating a biased amplifier circuit including wideband baseband biasing of an amplifier device.

Referring to FIG. 3, the circuit 300 is intended to illustrate one example embodiment encompassed herein in which different resonators are provided on the same impedance node, at allowing different frequency bands to be suppressed and to provide a wideband solution to address IMD signals.

A schematic diagram is provided to illustrate a biased amplifier circuit 300 that may include a high power amplifier 302, a baseband bias circuit 304, an RF decoupling circuit 330, and a bulk capacitor circuit 340.

The high power amplifier 302 includes a power transistor 308 that in the present example may be a FET, such as but not limited to an LDMOS FET having a gate (G), a source (S), and a drain (D). The gate of the power transistor 308 is coupled to an input port, which is configured to receive a relatively low-power RF signal to be amplified by the power transistor 308. The amplified RF signal is produced at output port 318, which in turn is coupled to an RF Out node. The RF Out node may be coupled through additional circuit elements (not illustrated) to a load (e.g., an antenna, not illustrated).

The drain is coupled to each of a first inductor 310 and a second inductor 312. The second inductor 312 is coupled in series between the drain of the power transistor 308 and a capacitor 314, and the capacitor 314 being coupled in series between the second inductor 312 and an additional port 316, which may be ground. The capacitance value of capacitor 314 may be selected to provide a virtual ground reference voltage for RF electrical signals, such that inductor 312 functions as a shunt inductance to the RF ground voltage, while the inductance of the second inductor 312 is chosen to provide desired impedance at the drain at the fundamental frequency of the amplifier circuit 300. The first inductor 310 may be coupled between the drain of the power transistor 308 and an output port 318 of the high power amplifier 302. In various embodiments, an output circuit including inductors 310, 312 and capacitor 314 in the illustrated configuration or in modified configurations may operate as a high pass filter circuit, as a low pass filter circuit or as a bandpass filter circuit.

The RF decoupling circuit 330 and the baseband bias circuit 304 may be coupled to node $V_X$ that may be further coupled to the high power amplifier 302 by way of a common conductive trace illustrated as a transmission line 350 exhibiting, for example, about a one-sixteenth wavelength ($\lambda/16$) phase shift. The RF decoupling circuit 330 may include a transmission line 320 exhibiting, for example, about a one-quarter wavelength ($\lambda/4$) phase shift. The RF decoupling circuit 330 may further include an RF decoupling capacitor 334 coupled between the transmission line 320 and a reference level, which may be ground. The RF decoupling capacitor 334 may be sized to decouple the carrier frequency presented at the gate of the power transistor 308 from the power supply $V_{DD}$. The RF decoupling capacitor 334 may be a discrete capacitor or may be a distributed capacitor. The bulk capacitor circuit 340 may include a first bulk capacitor 342 and a second bulk capacitor 344 for providing localized current sourcing from the power supply $V_{DD}$.

The baseband bias circuit 304 couples to the node $V_X$ and receives the bias current through the transmission line 320. The baseband bias circuit 304 may include a plurality of circuits with each circuit being specifically configured to resonate at different frequencies. For example, the baseband bias circuit 304 of FIG. 3 may include an envelope decoupling circuit 360 and a harmonic decoupling circuit 380, each respectively coupled between the node $V_X$ and an additional port 316, which may be ground. While two decoupling circuits are illustrated, more than two decoupling circuits is also contemplated.

The envelope decoupling circuit 360 includes a capacitor 322, an inductor 362, and a resistor 364 coupled in series. Although the capacitor 322, inductor 362, and resistor 364 are shown to be coupled in a particular order in the series circuit, the order of these components 322, 362, 364 may be different, in other embodiments. Because the envelope decoupling circuit 360 includes an RLC network of resistor 364, inductor 362 and capacitor 322, the peak operating voltages may be evenly distributed across the entire circuit rather than subjecting a single component, such as a single capacitor, to potentially damaging peak voltages. Further, at baseband frequencies, values for the resistor 364 and inductor 362 may be selected to behave as an impedance low while the value of capacitor 322 may be selected such that the resonance of the inductor and capacitor fall in the same baseband frequency range. For example, the capacitor 322 may have a capacitance value in a range of about 0.1 µF to about 10 µF (e.g., about 4.7 µF). The inductor 362 may have an inductance value in a range of about 0.25 nH to about 5 nH (e.g., about 1 nH), and the resistor 364 may have a resistance value in a range of about 0.5 ohms to about 3 ohms (e.g., about 1 ohm), when operated in a baseband frequency range of about 100 MHz to about 350 MHz (e.g., at a frequency of about 250 MHz). The resistor 364 may be configured as one or more bulk resistors (including surface mount resistors), or one or more printed resistors (including laser-trimmed resistors). The capacitor 322 may be configured as one or more discrete capacitor components, or may be implemented as a distributed capacitor formed as part of a printed circuit, such as part of a printed circuit or wiring board.

The capacitor 322 may be selected to have larger capacitance values ranging in tens or hundreds of microfarads, and may be used to provide a consistent impedance profile across a frequency band of choice. Further, the capacitor 322 may exhibit high impedance at RF frequencies (i.e., little or no loading effects) and may behave as a low impedance element at baseband frequencies (e.g., <200 MHz). The low impedance exhibited for low frequencies may result in the shunting of the signal energy at baseband frequencies.

The envelope decoupling circuit 360 further includes an inductor 362 configured in the form of a transmission line (e.g., a distributed inductor in the form of a printed conductive coil or a spiral transmission line). The inductor 362 may be formed according to the equations described below with respect to FIG. 4. The inductance value of inductor 362 may be selected, as described above, in conjunction with the value for capacitor 322 to resonate in a baseband frequency range of about 0 Hz to about 350 MHz.

The envelope decoupling circuit 360 further includes a resistor 364 coupled between the inductor 362 and a reference node, which may be ground. The resistor 364 provides electrical dampening and reduces the peak voltage magnitude at resonance frequency.

In operational applications, resistive and inductive parasitics of the capacitor 322 (i.e., modeled respectively as $R_c$, $L_c$) may prevent the capacitor 322 from achieving the desired high open impedance condition (desired at RF bands) and the baseband decoupling capacitor 322 may start to impact RF performance. Accordingly, the biased amplifier circuit 300 may further include a common conductive trace illustrated as a transmission line 350 coupled between the output of the high power amplifier 302 and the node $V_X$. The transmission line 350 provides a "back-off" of the capacitor 322 of the envelope decoupling circuit 360 from the drain terminal of the power transistor 308. In one embodiment, the transmission line 350 (e.g., a common conductive trace) is configured to have a minimum phase shift of about one-sixteenth of a wavelength ($\lambda/16$), where the baseband bias circuit impedance increases (due to normal wave phase/impedance rotation) and may be safely shunted by the baseband decoupling capacitor 322.

The harmonic decoupling circuit 380 includes a capacitor 324, an inductor 382, and a resistor 384. Because the harmonic decoupling circuit 380 includes an RLC network of resistor 384, inductor 382 and capacitor 324, the peak operating voltages may be evenly distributed across the entire circuit rather than subjecting a single component, such as a single capacitor, to potentially damaging peak voltages. Further, at a harmonic frequency, an inductance value for the inductor 382 may be selected to have a phase shift to cause an impedance displacement resulting in a harmonic termination. For example, the capacitor 324 may have a capacitance value in a range of about 0.1 nF to about 10 nF (e.g., about 1 nF), the inductor 382 may have an inductance value in a range of about 0.25 nH to about 5 nH (e.g., about 0.25 nH), and the resistor 384 may have a resistance value in a range of about 0.5 ohms to about 3 ohms (e.g., about 0.5 ohms), when operated at a baseband frequency in a range of about 100 MHz to about 350 MHz (e.g., about 350 MHz). The resistor 384 may be configured as one or more bulk resistors (including surface mount resistors), or one or more printed resistors (including laser-trimmed resistors). The capacitor 324 may be configured as one or more discrete capacitor components, or may be implemented as a distributed capacitor formed as part of a printed circuit, such as part of a printed circuit or wiring board.

The capacitor 324 may be selected to have larger values ranging in tens or hundreds of microfarads, and may be used to provide a consistent impedance profile across a frequency band of choice. Further, the capacitor 324 may exhibit high impedance at RF frequencies (i.e., little or no loading effects) and may behave as a low impedance element at a harmonic frequency (e.g., ~12 GHz). The low impedance exhibited for harmonic frequencies results in the shunting of harmonic signals.

The harmonic decoupling circuit 380 further includes an inductor 382 configured in the form of a transmission line (e.g., a distributed inductor in the form of a printed conductive coil or a spiral transmission line). The inductor 382 may be formed according to the equations described below with respect to FIG. 4. The inductance value of inductor 382 may be selected, as described above, in conjunction with the value for capacitor 324 to resonate in a baseband frequency range, where the baseband frequency range is between about 100 MHz and 350 MHz.

The harmonic decoupling circuit 380 further includes a resistor 384 coupled between the inductor 382 and a reference node, which may be ground. The resistor 384 provides electrical dampening and reduces the peak voltage magnitude at resonance frequency.

In operational applications, resistive and inductive parasitics of the capacitor 324 (i.e., modeled respectively as $R_c$, $L_c$) may prevent the capacitor 324 from achieving the desired high open impedance condition (desired at RF bands) and the capacitor 324 may start to impact RF performance. As stated above, the biased amplifier circuit 300 may further include a common conductive trace or a transmission line 350 coupled between the output of the high power amplifier 302 and the node $V_X$. The transmission line 350 provides a back-off of the capacitor 324 of the harmonic decoupling circuit 380 from the drain terminal of the power transistor 308. In one embodiment, the transmission line 350 is configured to have a minimum phase shift of about one-sixteenth of a wavelength ($\lambda/16$), where the baseband bias circuit impedance increases (due to normal wave phase/impedance rotation) and may be safely shunted by the capacitor 324.

Accordingly, a single baseband decoupling capacitor 322 may reduce, at most, the total baseband bias circuit inductance by a factor of ~0.75. An improvement to this factor may provide improved wideband performance. To even further improve this factor, multiple different baseband resonances may be created in the baseband bias circuit 304 (e.g., additional harmonic decoupling circuits), resulting in a more wideband termination.

Such a wideband termination may recover the baseband resonance to a factor of about √2 and may reduce resonance magnitude by a factor ~0.5. Therefore, the baseband decoupling circuits 360 and 380 may improve linearity of the biased amplifier circuit 300 resulting in an improved DPD linearization.

Further, the transmission line 320 provides a "back-off" of the RF decoupling capacitor 334 of the RF decoupling circuit 330 from the drain terminal of the power transistor 308. In one embodiment, the transmission line 320 may be configured to have a minimum phase shift of about one-quarter of a wavelength (λ/4). Otherwise, if the minimum phase shift was less than one-quarter of a wavelength (λ/4), then the RF impedance loading effect will be present on the amplifier and, when combined with baseband decoupling capacitors, may substantially degrade RF performance (i.e., reduction in gain and efficiency).

In one example embodiment corresponding to FIG. 3, the envelope decoupling circuit 360 may have components that are sized to decouple the envelope of the base band signal. For example, the first capacitor 322 may have a capacitance value in a range of about 0.1 µF to about 10 µF (e.g., on the order of about 4.7 µF) for suppressing baseband signals in a range of about 100 MHz to about 350 MHz (e.g., on the order of about 350 MHz). Further, the harmonic decoupling circuit 380 may have components that are sized to suppress a harmonic or an IMD, such as a third harmonic signal of the carrier frequency. For example, the second capacitor 324 may have a capacitance value in a range of about 0.1 nF to about 10 nF (e.g., on the order of about 1 nF) for suppressing a harmonic or other IMD signal in the frequency range of about 2 times (e.g., second harmonic) to 3 times (e.g., third harmonic) of the fundamental frequency.

Notwithstanding this example, the present disclosure is intended to encompass numerous other embodiments in which any of these capacitors have other capacitance values for addressing the breakdown voltages. By way of example, the vertical avalanche breakdown voltage from drain to source for an LDMOS device may be ~70 V while the breakdown voltage from drain to source for a GaN device may be ~150 V. Without the use of RF decoupling capacitors, the transitory peak voltages, which may develop at node $V_X$, may be given by the following simplified formula:

$$V_X = V_{DD} + VRF_{env} + V_{VBW} \quad (4)$$

where: $V_{DD}$ is the power supply voltage, $V_{RF}$ is the envelope voltage, and $V_{VBW}$ is the baseband resonance voltage. With the implementation of the harmonic decoupling circuit 380, the peak voltages from $V_{VBW}$ are greatly reduced to a minimum state level, therefore helping to maintain a total peak voltage low at node $V_X$.

The circuit 300 of FIG. 3 is intended to illustrate one example embodiment encompassed herein in which different resonators provide low impedance paths to ground for signal energy at difference harmonic frequencies such that different frequency bands may be suppressed to provide a wideband solution that addresses IMD signals. The respective resonant frequencies for the envelope decoupling circuit 360 and the harmonic decoupling circuit 380, both of FIG. 3, may be given by the following equations:

$$Fr_1 = \frac{1}{2\pi\sqrt{L_{line1} * Cline1}} \quad (5)$$

$$Fr_n = \frac{1}{2\pi\sqrt{L_{line2} * Cline2}} \quad (6)$$

In regard to Equations (5) and (6), it should be appreciated that the variable Fr$_i$ represents the resonant frequency associated with the envelope decoupling circuit 360 including capacitor 322 and the variable Fr$_n$ represents the resonant frequency associated with the harmonic decoupling circuit 380 including capacitor 324. The variable $L_{line1}$ represents the inductance of the inductor 362 associated with the envelope decoupling circuit 360 including the capacitor 322, and the variable $L_{line2}$ represents the inductance of the inductor 382 associated with the harmonic decoupling circuit 380 including the capacitor 324. Further, the variable $C_{line1}$ of Equation 5 represents the capacitance 322 connected with the inductor 362, formed as a distributed trace, and the variable $C_{line2}$ of Equation 6 represents the capacitance 324 connected with the inductor 382, also formed as a distributed trace.

Figure 4:
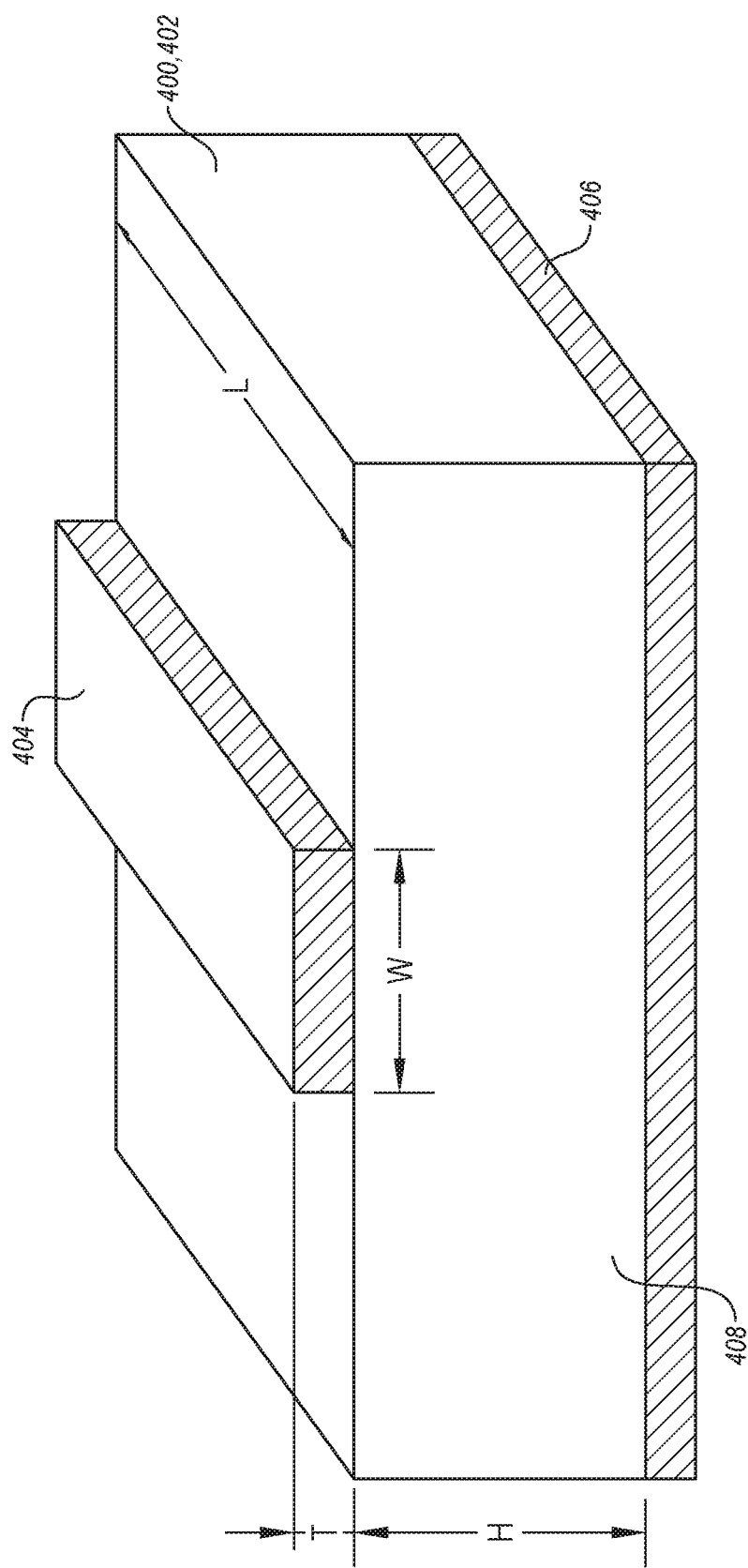
FIG. 4 is a perspective, partly-cross-sectional view of a microstrip transmission line that can be formed upon a printed circuit board (PCB), and that can serve as a distributed inductor and a phase shifting transmission line.

As mentioned above, the circuit 300 is particularly intended to be representative of PCB embodiments in which each of the inductors 362 and 382 is formed by way of a microstrip transmission line (e.g., a printed conductive coil). FIG. 4 is provided to illustrate schematically a cross-sectional, perspective view of a portion of a PCB of circuit 400 particularly having an example microstrip transmission line 402 formed thereon. As shown, the microstrip transmission line 402 particularly is formed by providing a conductive trace 404 (e.g., copper or another conductive material) that extends parallel to a conductive layer (e.g., a ground plane) 406 and that is separated from the conductive layer 406 along the length of the conductive trace by a gap 408 in which is provided a dielectric substrate material 408.

In view of FIG. 4, it should be appreciated that in the present embodiment calculation of the effective equivalent bias line inductance per bias line (that is, $L_{linen}$ for the various different values of n) can be performed in accordance with conventional microstrip theory according to the following Equation (7):

$$L_{TOT} \text{Lline}_n = 0.00508L[\ln(2L/(W+H)) + 0.5 + 0.2235 (W+H)/L] \quad (7)$$

In Equation (7) it should be appreciated that variables W and L respectively represent the width and length of the conductive trace 404 as measured within a plane that is parallel to the conductive layer 406, and along dimensions that are respectively perpendicular and parallel to the direction of signal propagation down the transmission line 402. Further, the variable H represents the distance between the conductive trace 404 and the conductive layer 406, measured perpendicular to the conductive layer 406 (or the plane of the conductive trace 404 that is parallel to that conductive layer), and thus represents the thickness of the gap 408. Further, the bias line inductance is also dependent on the mechanical dimensions (height (H)) of the material used to form the gap 408 of the PCB, and varies based on different types of materials. Although not found in Equation (7), it will also be appreciated that the conductive trace 404 itself has a thickness T also when measured perpendicular to the conductive layer 406 (or perpendicular to the plane of the conductive trace 404 that is parallel to that conductive layer).

Further, the voltage across the bulk decoupling capacitors 322 and 324 of envelope decoupling circuit 360 and the harmonic decoupling circuit 380 is the voltage difference between the nodes $V_X$ and $V_Y$ given by the following Equations 8 and 9:

$$V_Y = (|R+jwL|/(|R+jwL|+|jwC|)) * (VRF_{env} + V_{VBW}) = d * (VRF_{env} + V_{VBW}) \quad (8)$$

$$V_X - V_Y = (VDD + VRF_{env} + V_{VBW}) - V_Y = \sim VDD + (1-d) * (VRF_{env} + V_{VBW}) \quad (9)$$

where R is resistor 384, L is inductor 382, C is capacitor 324, d is equal to $((R+jwL)/[(R+jwL)+jwC]) * (VRFenv+Vvbw)$, $VRF_{env}$ is the envelope voltage of the fundamental frequency, and $V_{VBW}$ is the peak voltage from the baseband resonance circuit.

Accordingly, the reduced voltage $(V_X - V_Y)$ across the bulk decoupling capacitors 322 and 324 exhibits improved operational limits to avoid stresses due to voltage transients in excess of safety operational limits by reducing the $V_{DD}$ and $V_{VBW}$ exposure to voltage transients.

Additionally, the equivalent distributed element may include a calculated inductance such that, at RF frequencies (e.g., at a third harmonic), the phase value (relating to the length of the conductive trace) may induce sufficient degrees of phase/impedance rotation to complement an optimal termination for the third harmonic frequency. Derivation of the phase value (trace length) may be obtained from an analysis of other circuitry around the circuit 300. The distributed equivalent inductor may be estimated by the following formula:

$$L = Zo * \tan \theta \quad (10)$$

where L=inductance (nH), Zo=line impedance, θ=phase deg.

Figure 5:
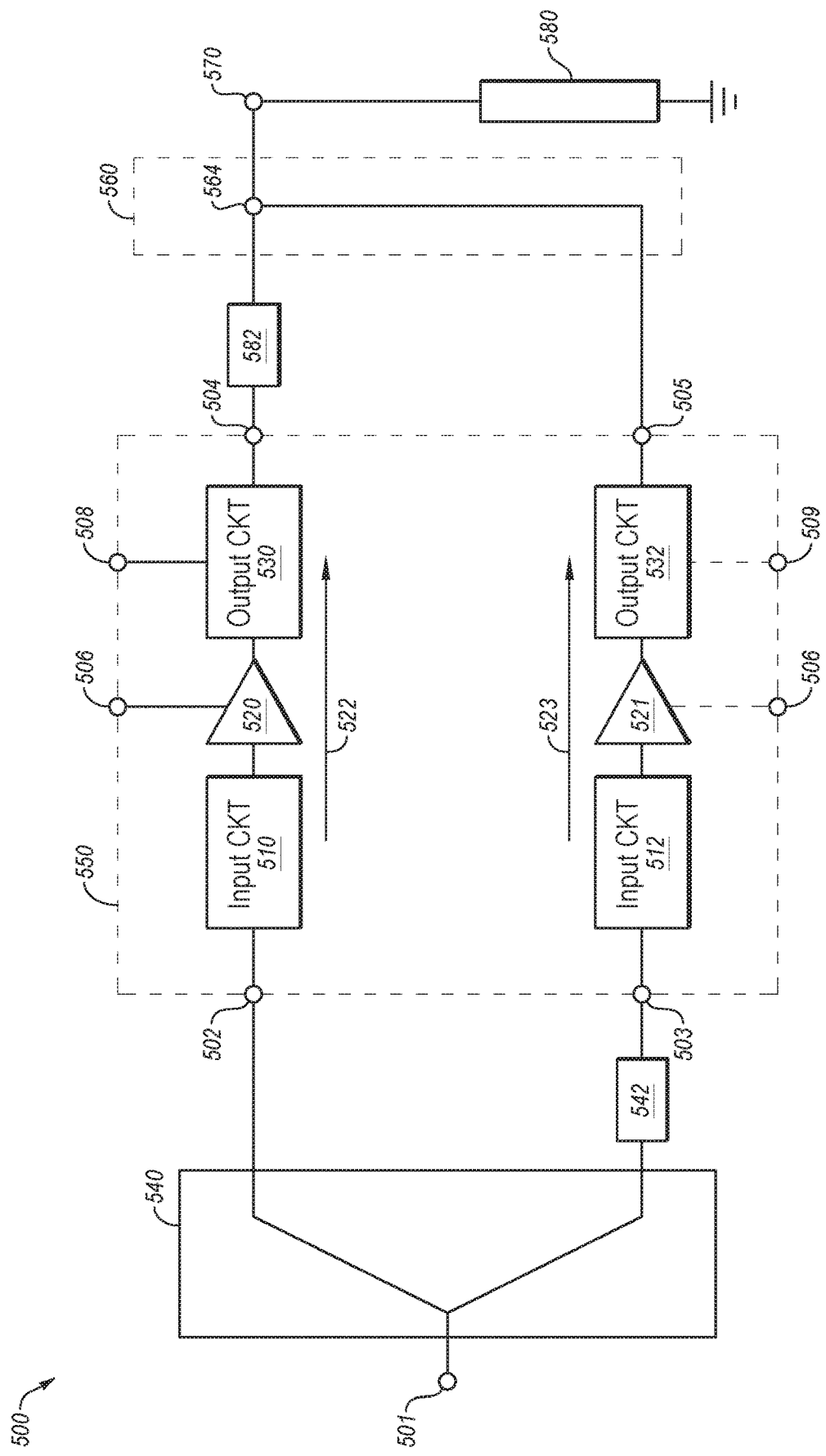
FIG. 5 is a block diagram of a Doherty power amplifier.

Turning to FIG. 5, a block diagram of a Doherty power amplifier (or amplifier system) 500, in accordance with an embodiment encompassed herein, is shown. The Doherty power amplifier 500 includes an input node 501, an output node 570, a power divider 540, an RF amplifier device 550 (e.g., one or more packaged power transistor devices), and a power combiner 560, according to the present embodiment. The power divider 540 is coupled between the input node 501 and input terminals 502, 503 to the RF amplifier device 550, and the power combiner 560 is coupled between output terminals 504, 505 of the RF amplifier device 550 and the output node 570. An input signal received at the input node 501 is amplified by the Doherty power amplifier (or amplifier system) 500 and provided to a load 580 (e.g., an antenna) via the output node 570.

More specifically, during operation, the power divider 540 is configured to divide the power of the input signal received at the input node 501 into multiple portions (e.g., equal portions) of the input signal, where respective portions of the input signal are provided to the input terminals 502, 503. For example, a first output of the power divider 540 may be coupled to the input terminal 502 corresponding to a first (or main) amplifier path 522, and a second output of the power divider 540 may be coupled to the input terminal 503 corresponding to a second (or peaking) amplifier path 523. The power divider 540 may divide the input power equally among the amplifier paths 522, 523, such that roughly half of the input signal power is provided to each amplifier path 522, 523. Alternatively, the power divider 540 may divide the power unequally.

The Doherty power amplifier (or amplifier system) 500 includes a first phase inversion element 542 between the second output of the power divider 540 and the input terminal 503 corresponding to the peaking amplifier path 523. For example, the first phase inversion element 542 may be implemented as a quarter wave transmission transformer (e.g., a 90° phase length transmission line) or a lumped element implementation of a 90° phase transformer. The Doherty power amplifier (or amplifier system) 500 also includes a second phase inversion element 562 between the output terminal 504 corresponding to the main amplifier path 522 and a summing node 564 of the power combiner 560. The output terminal 505 of the peaking amplifier path 523 is also coupled to the summing node 564. As with the first phase inversion element 542, the second phase inversion element 562 may be implemented as a quarter wave transmission transformer (e.g., a 90° phase length transmission line) or a lumped element implementation of a 90° phase transformer. The combination of phase inversion elements 542, 562 ensures that the currents ultimately provided to the summing node 564 by the respective amplifier paths 522, 523 are provided substantially in-phase with each other. Accordingly, the current provided by the summing node 564 to the output node 570 (and to the load 580) represents the in-phase summation of the currents provided by the amplifier paths 522, 523.

In an alternate embodiment, positive and negative phase shifts may be applied along both of the amplifier paths 522, 523 at the inputs of the device 550 to achieve approximately 90° of phase difference between the signals processed through the device 550 along the main and peaking amplifier paths 522, 523. Similarly, positive and negative phase shifts may be applied along both of the amplifier paths 522, 523 at the outputs of the device 550 to ensure that the signals are combined in phase at the summing node 564. In another alternate embodiment, the amplifier system may be configured in an "inverted Doherty" configuration. In such a configuration, the input side phase inversion element is included at the input to the main amplifier path (rather than at the input to the peaking amplifier path), and the output side phase inversion element is included at the output of the peaking amplifier path (rather than at the output of the main amplifier path).

As already noted, the RF amplifier device 550 includes multiple amplifier paths, namely, in this example, the amplifier paths 522, 523. Each of the amplifier paths 522, 523 includes an input impedance matching circuit (INPUT CKT) 510, 512, respectively, one or more amplifier stages 520, 521, respectively, and an output impedance matching circuit (OUTPUT CKT) 530, 532, respectively, coupled in series between the input terminals 502, 503, respectively, and the output terminals 504, 505, respectively, of the device 550. Each of the amplifier stages 520, 521 may be coupled to a voltage reference plane (e.g., ground) through terminals 506.

According to various embodiments, the Doherty power amplifier 500 may be a symmetrical Doherty power amplifier or an asymmetrical Doherty power amplifier. Accordingly, the amplifier stages 520, 521 may be symmetrical (i.e., substantially the same size) or asymmetrical (i.e., of different sizes). In the Doherty configuration, the amplifier stage 520 may be configured and operated as a main amplifier, and the amplifier stage 521 may be configured and operated as a peaking amplifier. The main amplifier stage 520 may be configured as a Class AB amplifier, meaning that the transistor arrangement of the main amplifier stage 520 is biased to provide a conduction angle between 90 and 360 degrees. Conversely, the peaking amplifier stage 521 may be realized as a transistor arrangement configured as a Class C amplifier, meaning that the transistor arrangement of the peaking amplifier stage 521 may be biased to provide a conduction angle less than 90 degrees. For example, bias voltages may be provided to the main and peaking amplifier stages 520, 521 through terminals 508, 509, each of which may be coupled to an appropriate bias circuit.

The main and peaking amplifier stages 520, 521 also may be coupled to other circuitry through terminals 508, 509. For example, the amplifier stages 520, 521 may be coupled to envelope frequency termination circuitry or other circuitry by way of the terminals 508, 509. Additionally, in other embodiments bias lines are not part of the amplifier stages but rather are coupled to one or more of the terminals 508, 509. That is, in such other embodiments, the bias lines would be external relative to the device 550 as shown in FIG. 5.

Each of the input impedance matching circuits 510, 512 is configured to provide a desired input impedance at its respective input terminal 502, 503 at the fundamental frequency (or carrier frequency) of the Doherty power amplifier (or amplifier system) 500. Further, each of the output impedance matching circuits 530, 532 may be configured to provide a desired output impedance at its respective output terminal 504, 505 at the fundamental frequency of the Doherty power amplifier (or amplifier system) 500. In an exemplary embodiment, the Doherty power amplifier (or amplifier system) 500 is used to transmit RF signals, and the fundamental frequency (or carrier frequency) is the frequency of transmittance.

It should be understood that FIG. 5 is a simplified representation of a Doherty power amplifier (or amplifier system) 500 for purposes of explanation and ease of description, and that practical embodiments may include other devices and components to provide additional functions and features, and/or the amplifier system 500 may be part of a much larger electrical system, as will be understood. For example, embodiments of devices discussed herein may be incorporated into amplifiers having a single amplification path or more than two amplification paths, as well as amplifiers having configurations other than Doherty configurations.

Figure 6A:
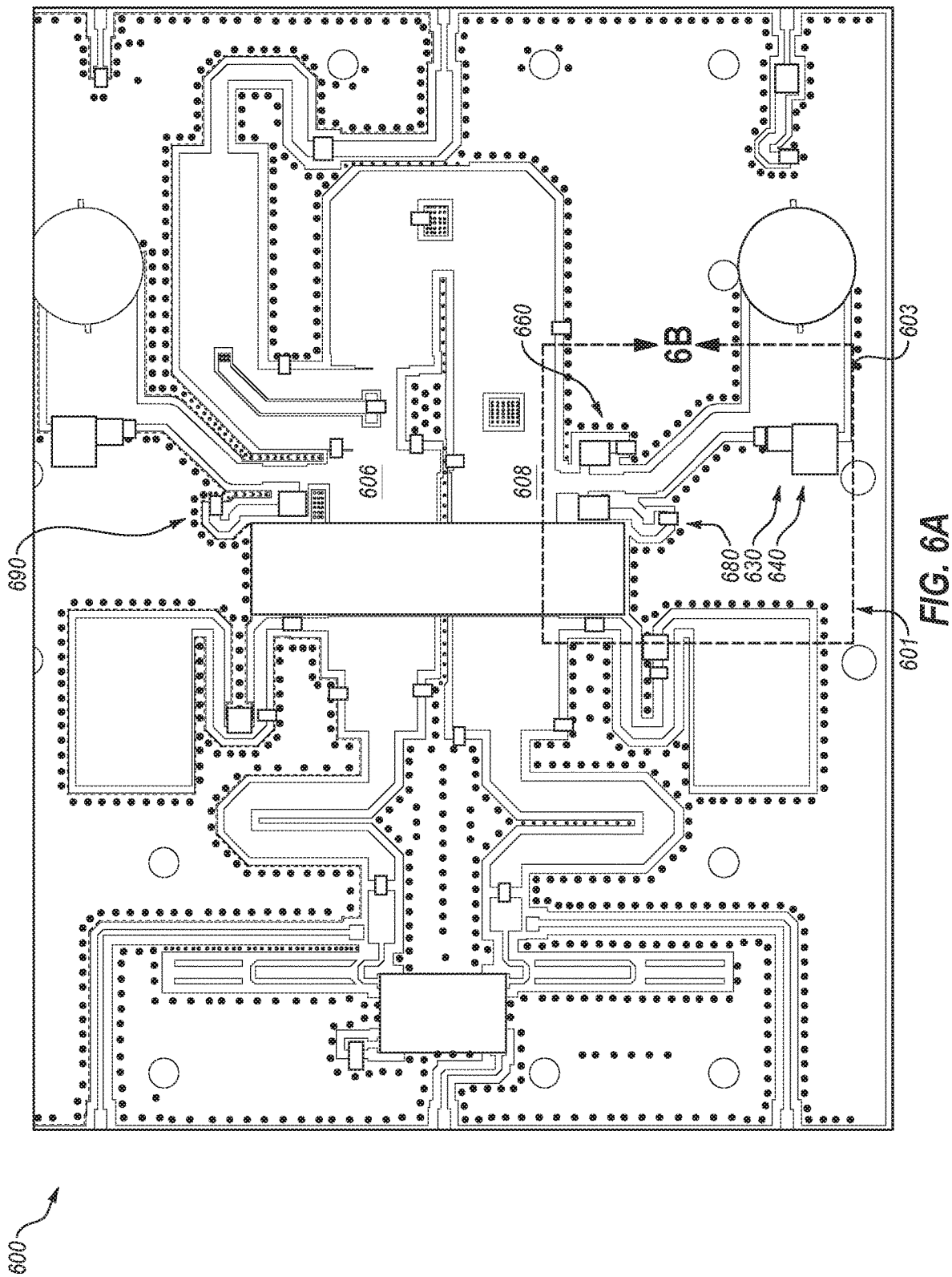
FIGS. 6A and 6B are top plan views of an example PCB having structures that form (at least in part) a circuit including a high power amplifier, bias circuits, and decoupling circuits.
Figure 6B:
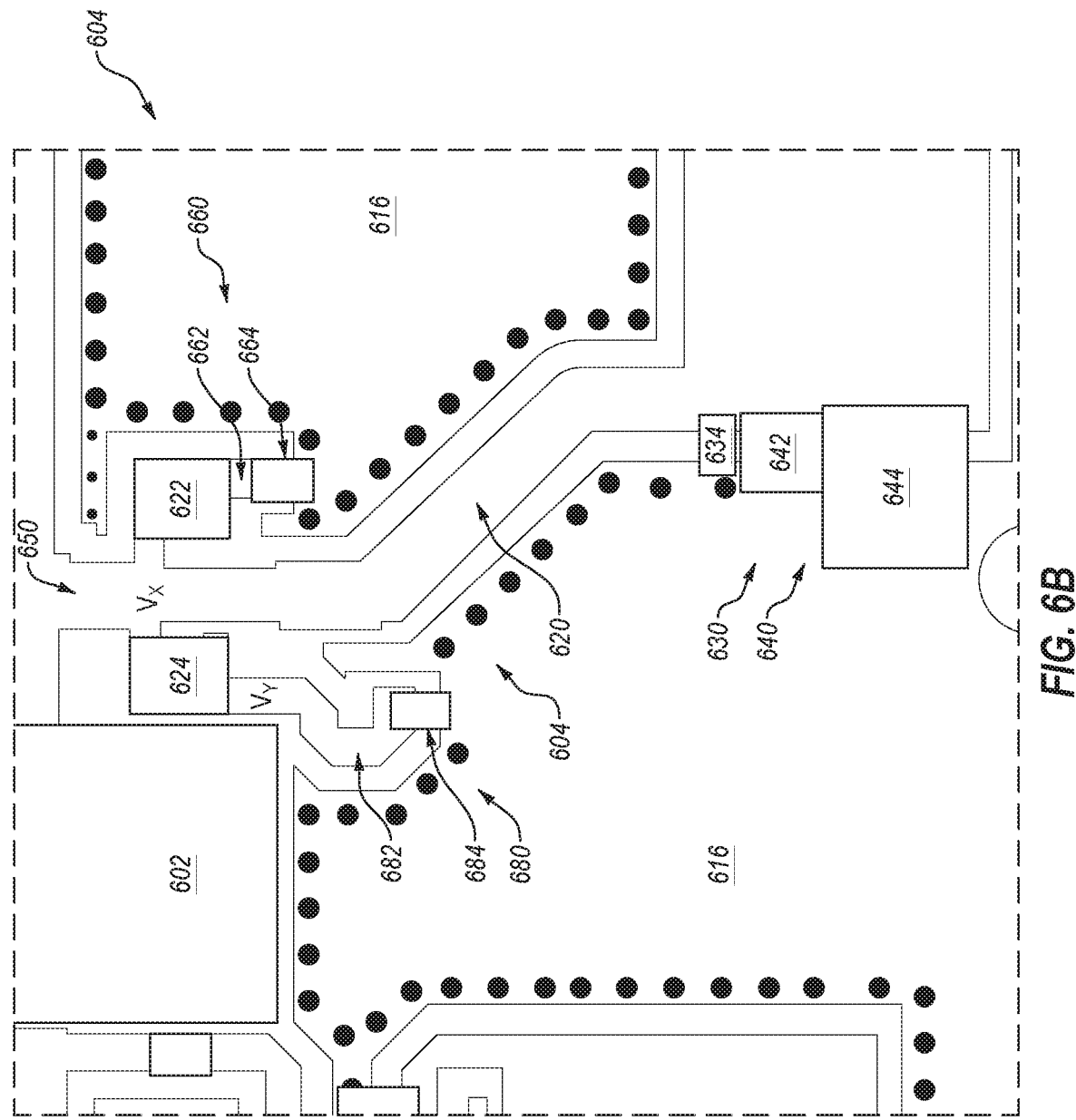

Referring to FIG. 6A, a top plan view of a portion of a PCB system 600 having a wideband baseband biased circuit is provided. The PCB system 600 particularly includes components 601 that operate as a Doherty power amplifier in combination with a circuit 603 corresponding to the RF decoupling circuit 330, bulk capacitor circuit 340, envelope decoupling circuit 360, and harmonic decoupling circuit 380 of the biased amplifier circuit 300 of FIG. 3, and that therefore is an embodiment that is represented by (or encompassed by or corresponds to) the circuit 300 of FIG. 3. Further, FIG. 6B shows in more detail a top plan view of the circuit 603 having the RF decoupling circuit 630 (e.g., RF decoupling circuit 330), bulk capacitor circuit 640 (e.g., bulk capacitor circuit 340), envelope decoupling circuit 660 (e.g., envelope decoupling circuit 360), and harmonic decoupling circuit 680 (e.g., harmonic decoupling circuit 380). FIG. 6A and FIG. 6B may be collectively referenced herein as FIG. 6.

It should be appreciated that, although only a top plan view of a portion of the PCB system 600 is shown in FIG. 6, all of the components 601 and the circuit 603 are formed as part of a PCB that also includes multiple layers including a conductive (e.g., ground plane) layer, one or more additional conductive layers at which conductive traces are formed, and a dielectric substrate layer between adjacent conductive layers. Because FIG. 6 shows a top plan view, the features shown in FIG. 6 particularly include conductive traces formed on a top conductive layer of the aforementioned additional layer(s) and portions of an uppermost dielectric substrate layer that are revealed at locations at which no conductive traces of the top conductive layer are present.

The circuit 603 includes a first microstrip transmission line or trace 606 and a second microstrip transmission line or trace 608. The trace 606 may be electrically coupled to the output of a carrier amplifier portion of a Doherty amplifier, and the trace 608 may be electrically coupled to the output of a peaking amplifier portion of the Doherty amplifier. While the embodiments described herein may have application to one or both of the carrier or peaking amplifier outputs of a Doherty amplifier, for brevity and clarity, the baseband bias circuit 304 of FIG. 3 is illustrated in FIG. 6 with respect to the peaking amplifier output of the Doherty amplifier. Those of skill in the art appreciate that the trace 606 and the trace 608 are electrically coupled together after signals on trace 608 undergo an impedance transformation.

FIG. 6B illustrates approximate locations of nodes $V_X$ and $V_Y$, as described above with respect to FIG. 3. The RF decoupling circuit 630 and a baseband bias circuit 604 may be coupled to node $V_X$ that may be further coupled to a high power amplifier 602 (e.g., a power transistor such as transistor 308) by way of a transmission line 650 (e.g., transmission line 350) exhibiting, for example, about a one-sixteenth wavelength ($\lambda/16$) phase shift. The RF decoupling circuit 630 may include a transmission line 620 (e.g., a transmission line 320) exhibiting, for example, about a one-quarter wavelength ($\lambda/4$) phase shift. The RF decoupling circuit 630 may further include an RF decoupling capacitor 634 (e.g., RF decoupling capacitor 334) coupled between the transmission line 620 and a reference level, which may be ground (e.g., one terminal of capacitor 634 may be electrically connected using conductive via(s) to a ground plane on the back side of the PCB). The RF decoupling capacitor 634 may be sized to decouple the carrier frequency presented at the drain of the power transistor (e.g., power transistor 308 of FIG. 3) from reaching the power supply $V_{DD}$. The RF decoupling capacitor 634 may be a discrete capacitor or may be a distributed capacitor.

The bulk capacitor circuit 640 may include a first bulk capacitor 642 and a second bulk capacitor 644 (e.g., a bulk capacitor(s) 342) for providing localized current sourcing from a power supply $V_{DD}$.

The baseband bias circuit 604 couples to the node $V_X$ and receives the bias current through the transmission line 620. The transmission line 620 may be generally shaped to provide the desired phase shifting. In one embodiment, the transmission line 620 may be configured to generate about a one-quarter wavelength ($\lambda/4$) phase shift. The baseband bias circuit 604 may include a plurality of circuits, as described above with each circuit being specifically configured to resonate at different frequencies. For example, the baseband bias circuit 604 may include an envelope decoupling circuit 660 and a harmonic decoupling circuit 680, each respectively coupled between the node $V_X$ and a trace 616 for coupling to a reference signal, which may be ground. While two decoupling circuits are illustrated, more than two decoupling circuits is also contemplated.

The envelope decoupling circuit 660 includes a capacitor 622 (e.g., a capacitor 322), an inductor 662 (e.g., an inductor 362), and a resistor 664 (e.g., a resistor 364). Because the envelope decoupling circuit 660 includes an RLC network of the resistor 664, inductor 662 and capacitor 622, the peak operating voltages may be evenly distributed across the entire circuit rather than subjecting a single component, such as a single capacitor, to potentially damaging peak voltages. Further, at baseband frequencies, values for the resistor 664 and inductor 662 may be selected to behave as an impedance low while the capacitor 622 may be selected such that the resonance of the inductor 662 and capacitor 622 fall in the same frequency. For example, the capacitor 622 may have a capacitance value in a range of about 1 µF to about 10 µF (e.g., about 4.7 µF). The inductor 662 may have an inductance value in a range of about 0.25 nH to about 5 nH (e.g., about 1 nH), and the resistor 664 may have a resistance value in a range of about 0.5 ohms to about 3 ohms (e.g., about 1 ohm), when operated in a frequency range of about 100 MHz to about 350 MHz (e.g., at a frequency of about 350 MHz). The capacitor 622 may be configured as one or more discrete capacitor components, or may be implemented as distributed capacitors formed as part of a printed circuit, such as part of a printed circuit or wiring board.

The capacitor 622 may be selected to have a relatively large capacitance value ranging in tens or hundreds of microfarads, and may be used to provide a consistent impedance profile across a frequency band of choice. Further, the capacitor 622 may exhibit high impedance at RF frequencies (i.e., little or no loading effects) and may behave as a low impedance element at baseband frequencies (e.g., 800 MHz). It is noted that the baseband frequency is a function of the carrier frequency. If the carrier frequency is under 1 GHz, then the baseband frequency will be <350 MHz. If the carrier frequency is, for example, 2 GHz, then the baseband frequency will be <800 MHz. The low impedance exhibited for low frequencies results in the shunting of signal energy in a baseband frequency range.

The harmonic decoupling circuit 680 includes a capacitor 624 (e.g., a capacitor 324), an inductor 682 (e.g., an inductor 382), and a resistor 684 (e.g., a resistor 384). Because the harmonic decoupling circuit 680 includes an RLC network of resistor 684, inductor 682 and capacitor 624, the peak operating voltages may be evenly distributed across the entire circuit rather than subjecting a single component, such as a single capacitor, to potentially damaging peak voltages. Further, at a harmonic frequency, an inductance value for the inductor 682 may be selected to have a phase shift to cause an impedance displacement resulting in a harmonic termination. The capacitor 624 may be configured as one or more discrete capacitor components, or may be implemented as distributed capacitors formed as part of a printed circuit, such as part of a printed circuit or wiring board.

The capacitor 624 may be selected to have a relatively large capacitance value ranging in tens or hundreds of microfarads, and may be used to provide a consistent impedance profile across a frequency band of choice. Further, the capacitor 624 may exhibit high impedance at RF frequencies (i.e., little or no loading effects) and may behave as a low impedance element at a harmonic frequency (e.g., ~12 GHz). The low impedance exhibited for a harmonic frequency results in the shunting of signal energy at the harmonic frequency.

In operational applications, parasitics of the capacitor 624 (i.e., $R_c$, $L_c$) may prevent the capacitor 624 from achieving the desired high open impedance condition (desired at RF bands) and the capacitor 624 may start to impact RF performance. PCB system 600 may further include a transmission line 650 (e.g., a transmission line 350) coupled between the output of the high power amplifier 602 and the node $V_X$. The transmission line 650 provides a back-off of the capacitor 624 of the harmonic decoupling circuit 680 from the drain terminal of the power transistor of high power amplifier 602. In one embodiment, the transmission line 650 is configured to have a minimum phase shift of about one-sixteenth of a wavelength ($\lambda/16$), where the baseband bias circuit impedance increases (due to normal wave phase/impedance rotation) and may be safely shunted by the capacitor 624.

It should be appreciated that the present disclosure is intended to encompass many different embodiments of a wideband baseband bias circuit. The baseband bias circuit 604 may provide an improved performance over conventional biasing and may result in an improvement of ~+15 decibel (dB) IMD reduction across the band. Further, the baseband bias circuit 604 for a Doherty circuit shifts the $V_{BW}$ resonance to a higher frequency and lower amplitude.

Yet further, adding an RLC network to each of the envelope decoupling circuit 660 and the harmonic decoupling circuit 680 may evenly distribute peak voltages across the RLC network, specially across the baseband decoupling capacitors (nodes $V_X$, $V_Y$). At baseband frequencies, values for resistors 664, 684 and inductors 662, 682 may be chosen such they behave as close to an impedance low while capacitors 622, 624 (baseband capacitors) are selected such that the resonance ~LC products also fall in the same baseband frequency. At a third harmonic frequency, the equivalent distributed inductance, L, may be designed to have a desired phase, θ, that may be used in such a way that will introduce an impedance displacement to reach an optimal harmonic termination.

Further, various portions of the components and PCB layout of FIG. 6A and FIG. 6B may be integrated within an amplifier package, illustrated as RF amplifier device 550 of FIG. 5. For example, the illustrated decoupling circuits and/or inductors, capacitors, and resistors may be implemented as integrated passive devices (IPDs) or with discrete inductors, capacitors, and resistors.

In view of the above discussion, it will be appreciated that embodiments of circuits or systems such as those described above or otherwise encompassed herein may provide any of a variety of advantages. Among other things, in at least some such embodiments, the design and implementation of enhanced wideband design bias lines feeds for high power Doherty amplifiers has been disclosed. The disclosed embodiments may provide at least a first improvement to the functional frequency response of the bias lines over a wideband frequency range, and at least a second improvement where biasing may be performed at baseband and at an intermodulation distortion frequency such as a third harmonic frequency.

Such improvements are realized by a potential reduction in the equivalent inductance across a functional frequency band. The lower inductance may result in a higher baseband resonance capable of handling wider band signals, an improvement on raw linearity (e.g., in dBc), and in an improvement to linearization of high power Doherty amplifiers designs. Accordingly, the baseband bias circuit may be tuned to serve both baseband and third harmonic frequency bands with the bias circuit tuned to operate with a Doherty amplifier circuit to support a third harmonic path loss, thereby reducing intermodulation byproducts. Further, electrical stresses on baseband decoupling capacitors (e.g., breakdown voltage limits) may be reduced since an RLC network distributes the instantaneous peak voltages across all RLC components.

In view of the foregoing, numerous embodiments are intended to be encompassed herein. In at least some such embodiments, for example, a radio frequency (RF) amplifier circuit may include an amplifier device having a first input configured to receive a first signal to be amplified and a first output configured to output a first amplified signal. The RF amplifier circuit may further include a first baseband bias circuit having an input coupled to the first output of the amplifier device. The first baseband bias circuit may have a first envelope decoupling circuit and a first harmonic decoupling circuit where the first envelope decoupling circuit includes a first bulk capacitor and a first distributed inductor configured to resonate in a baseband frequency range. The first harmonic decoupling circuit may include a second bulk capacitor and a second distributed inductor configured to resonate at a harmonic frequency of the frequency of the first signal received at the input of the amplifier device.

Additionally, the first and second distributed inductors may include first and second conductive traces on a printed circuit board (PCB). Further, the first envelope decoupling circuit may further include a first resistor coupled between the first distributed inductor and a reference signal terminal of the RF amplifier circuit, and the first harmonic decoupling circuit may further include a second resistor coupled between the second distributed inductor and the reference signal terminal of the RF amplifier circuit. Yet further, the circuit may further include a one-sixteenth wavelength transmission line coupled between the first output of the amplifier device and the input of the first baseband bias circuit. Also, the circuit may further include an RF decoupling circuit coupled to the input of the first baseband bias circuit, where the RF decoupling circuit includes an RF decoupling capacitor coupled between a power terminal and the reference signal terminal. The circuit may also include a one-quarter wavelength transmission line coupled between the input of the first baseband bias circuit and the power terminal. In other forms such as a Doherty configuration, the amplifier device may further include a second input configured to receive a second signal to be amplified and a second output configured to output a second amplified signal. A power divider with an input and first and second outputs may also be included where the power divider may be configured to divide the power of an input signal received at the input into the first signal and the second signal. The second amplifier configuration may also include a second baseband bias circuit, in whole or in part, as described above.

In another embodiment encompassed herein, an RF module includes a PCB, an amplifier device, and a first baseband bias circuit. The PCB may include a first conductive layer, a second conductive layer, and a dielectric substrate positioned between the first and second conductive layers. The amplifier device may be coupled to a first side of the PCB, with the amplifier device including a first input configured to receive a first signal to be amplified and a first output configured to output a first amplified signal, wherein the first input and the first output are electrically coupled to one of the first and second conductive layers of the PCB. The first baseband bias circuit may include an input coupled to the first output of the amplifier device, and the first baseband bias circuit may include a first envelope decoupling circuit and a first harmonic decoupling circuit. The first envelope decoupling circuit may include a first bulk capacitor and a first distributed inductor configured to resonate in a baseband frequency range. The first harmonic decoupling circuit may include a second bulk capacitor and a second distributed inductor configured to resonate at a harmonic frequency of the frequency of the first signal received at the first input of the amplifier device, wherein the first and second distributed inductors may be each formed from first and second transmission lines formed from one or more portions of the first and second conductive layers.

Additionally, at least one of the first and second distributed inductors may be formed from conductive coil of one of the first and second transmission lines. Further, the first envelope decoupling circuit may further include a first resistor coupled between the first distributed inductor and a reference signal terminal of the RF amplifier circuit, and the first harmonic decoupling circuit may further include a second resistor coupled between the second distributed inductor and the reference signal terminal of the RF amplifier circuit. The first and second resistors may be one of a discrete resistor or a printed resistor printed on the PCB. Yet further, the RF module may further include a one-sixteenth wavelength transmission line formed from one or more portions of the first and second conductive layers of the PCB between the first output of the amplifier device and the input of the first baseband bias circuit.

Also, the RF module may further include an RF decoupling circuit and a one-quarter wavelength transmission line. The RF decoupling circuit is coupled to the input of the first baseband bias circuit and may include an RF decoupling capacitor coupled between a power terminal and the reference signal terminal. The one-quarter wavelength transmission line may be formed on one of the first and second conductive layers of the PCB between the input of the first baseband bias circuit and the power terminal. In other forms such as a Doherty configuration, the RF module may further include a second input configured to receive a second signal to be amplified and a second output configured to output a second amplified signal. A power divider may be formed on one of the first and second conductive layers of the PCB and may include an input and first and second outputs, with the power divider configured to divide the power of an input signal received at the input into the first signal and the second signal. The RF module may further include a power combiner formed from one or more portions of the first and second conductive layers of the PCB and coupled between the first and second amplified signals and configured to combine in-phase the first and second amplified signals.

In yet another embodiment encompassed herein, an RF circuit may include a PCB having a first layer level, a second layer level, and a dielectric substrate positioned between the first and second layer levels. A plurality of conductive traces may be positioned at the first layer level, wherein the plurality of conductive traces may be configured as part of a first baseband bias circuit including an envelope decoupling circuit and a harmonic decoupling circuit. The plurality of conductive traces may include a common conductive trace having a first end for coupling to a first amplified output signal and a second end for coupling to a first end of a first bulk capacitor of the envelope decoupling circuit and for coupling to a first end of a second bulk capacitor of the harmonic decoupling circuit. The plurality of conductive traces may further include a first distributed inductor coupled between a second end of the first bulk capacitor and a first resistor where the first distributed inductor may be configured to resonate with the first bulk capacitor in a baseband frequency range. The plurality of conductive traces may yet further include a second distributed inductor coupled between a second end of the second bulk capacitor and a second resistor, where the second distributed inductor may be configured to resonate with the second bulk capacitor at a harmonic frequency of the first amplified output signal.

Additionally, the common conductive trace may be further configured as a one-sixteenth wavelength transmission line. Further, the first distributed inductor may be configured to exhibit an inductance in the range of 0.25 nH to 5 nH. Yet further, the second distributed inductor may be configured to exhibit an inductance in the range of 0.25 nH to 5 nH.

While the principles of the invention have been described above in connection with specific apparatus, it is to be clearly understood that this description is made only by way of example and not as a limitation on the scope of the invention. It is specifically intended that the present invention not be limited to the embodiments and illustrations contained herein, but include modified forms of those embodiments including portions of the embodiments and combinations of elements of different embodiments as come within the scope of the following claims.

What is claimed is:

1. A radio frequency (RF) amplifier circuit, comprising:
an amplifier device including a first input configured to receive a first signal to be amplified and a first output configured to output a first amplified signal; and
a first baseband bias circuit including an input coupled to the first output of the amplifier device, the first baseband bias circuit including a first envelope decoupling circuit and a first harmonic decoupling circuit, the first envelope decoupling circuit including a first bulk capacitor and a first distributed inductor configured to resonate in a baseband frequency range of the first signal, the first harmonic decoupling circuit including a second bulk capacitor and a second distributed inductor configured to resonate at a harmonic frequency of the frequency of the first signal received at the input of the amplifier device;
wherein the first envelope decoupling circuit further includes a first resistor coupled between the first distributed inductor and a reference signal terminal of the RF amplifier circuit, and the first harmonic decoupling circuit further includes a second resistor coupled between the second distributed inductor and the reference signal terminal of the RF amplifier circuit.

2. The RF amplifier circuit of claim 1, wherein the first and second distributed inductors include first and second conductive traces on a printed circuit board (PCB).

3. A radio frequency (RF) amplifier circuit, comprising:
an amplifier device including a first input configured to receive a first signal to be amplified and a first output configured to output a first amplified signal;
a first baseband bias circuit including an input coupled to the first output of the amplifier device, the first baseband bias circuit including a first envelope decoupling circuit and a first harmonic decoupling circuit, the first envelope decoupling circuit including a first bulk capacitor and a first distributed inductor configured to resonate in a baseband frequency range of the first signal, the first harmonic decoupling circuit including a second bulk capacitor and a second distributed inductor configured to resonate at a harmonic frequency of the frequency of the first signal received at the input of the amplifier device; and
a one-sixteenth wavelength transmission line coupled between the first output of the amplifier device and the input of the first baseband bias circuit.

4. The RF amplifier circuit of claim 1, further comprising:
an RF decoupling circuit coupled to the input of the first baseband bias circuit, the RF decoupling circuit including an RF decoupling capacitor coupled between a power terminal and the reference signal terminal; and
a one-quarter wavelength transmission line coupled between the input of the first baseband bias circuit and the power terminal.

5. The RF amplifier circuit of claim 1, wherein the amplifier device further includes a second input configured to receive a second signal to be amplified and a second output configured to output a second amplified signal.

6. The RF amplifier circuit of claim 5, further comprising a power divider including an input and first and second outputs, the power divider configured to divide the power of an input signal received at the input into the first signal and the second signal.

7. The RF amplifier circuit of claim 5, further comprising a second baseband bias circuit including an input coupled to the second output of the amplifier device, the second baseband bias circuit including at least one of a second envelope decoupling circuit and a second harmonic decoupling circuit, the second envelope decoupling circuit including a third bulk capacitor and a third distributed inductor configured to resonate in a baseband frequency range of the second signal received at the second input of the amplifier device, the second harmonic decoupling circuit including a fourth bulk capacitor and a fourth distributed inductor configured to resonate at a harmonic frequency of the frequency of the second signal received at the second input of the amplifier device.

8. A radio frequency (RF) module, comprising:
a printed circuit board (PCB) including a first conductive layer, a second conductive layer, and a dielectric substrate positioned between the first and second conductive layers;
an amplifier device coupled to a first side of the PCB, the amplifier device including a first input configured to receive a first signal to be amplified and a first output configured to output a first amplified signal, the first input and the first output electrically coupled to one of the first and second conductive layers of the PCB; and
a first baseband bias circuit including an input coupled to the first output of the amplifier device, the first baseband bias circuit including a first envelope decoupling circuit and a first harmonic decoupling circuit, the first envelope decoupling circuit including a first bulk capacitor and a first distributed inductor configured to resonate in a baseband frequency range of the first signal received at the first input of the amplifier device, the first harmonic decoupling circuit including a second bulk capacitor and a second distributed inductor configured to resonate at a harmonic frequency of the frequency of the first signal received at the first input of the amplifier device, the first and second distributed inductors each formed from first and second transmission lines on one of the first and second conductive layers;
wherein the first envelope decoupling circuit further includes a first resistor coupled between the first distributed inductor and a reference signal terminal of the RF amplifier circuit, and the first harmonic decoupling circuit further includes a second resistor coupled between the second distributed inductor and the reference signal terminal of the RF amplifier circuit, wherein the first and second resistors are one of a discrete resistor or a printed resistor printed on the PCB.

9. The RF module of claim 8, wherein at least one of the first and second distributed inductors is formed from at least a partially spiral transmission line configuration of one of the first and second transmission lines.

10. The RF module of claim 8, further comprising a one-sixteenth wavelength transmission line formed on one of the first and second conductive layers of the PCB between the first output of the amplifier device and the input of the first baseband bias circuit.

11. The RF module of claim 10, further comprising:
an RF decoupling circuit coupled to the input of the first baseband bias circuit, the RF decoupling circuit including an RF decoupling capacitor coupled between a power terminal and the reference signal terminal; and
a one-quarter wavelength transmission line formed on one of the first and second conductive layers of the PCB between the input of the first baseband bias circuit and the power terminal.

12. The RF module of claim 8, the amplifier device further includes a second input configured to receive a second signal to be amplified and a second output configured to output a second amplified signal.

13. The RF module of claim 12, further comprising a power divider coupled to the PCB and including an input and first and second outputs, the power divider configured to divide the power of an input signal received at the input into the first signal and the second signal.

14. The RF module of claim 13, further comprising a power combiner coupled to the PCB and coupled between the first and second amplified signals and configured to combine in-phase the first and second amplified signals.

15. A radio frequency (RF) circuit, comprising:
a printed circuit board (PCB) having a first layer level, a second layer level, and a dielectric substrate positioned between the first and second layer levels, wherein a plurality of conductive traces are positioned at the first layer level, wherein the plurality of conductive traces are configured as part of a first baseband bias circuit including an envelope decoupling circuit and a harmonic decoupling circuit, the plurality of conductive traces including a common conductive trace having a first end for coupling to a first amplified output signal and a second end for coupling to a first end of a first bulk capacitor of the envelope decoupling circuit and for coupling to a first end of a second bulk capacitor of the harmonic decoupling circuit, the plurality of conductive traces further including a first distributed inductor coupled between a second end of the first bulk capacitor and a first resistor, the first distributed inductor configured to resonate with the first bulk capacitor in a baseband frequency range of the first amplified output signal, and the plurality of conductive traces yet further including a second distributed inductor coupled between a second end of the second bulk capacitor and a second resistor, the second distributed inductor configured to resonate with the second bulk capacitor at a harmonic frequency of the first amplified output signal.

16. The RF circuit of claim 15, wherein the common conductive trace is further configured as a one-sixteenth wavelength transmission line.

17. The RF circuit of claim 15, wherein the first distributed inductor has an inductance value in the range of 0.25 nH to 5 nH.

18. The RF circuit of claim 15, wherein the second distributed inductor has an inductance value in the range of 0.25 nH to 5 nH.

19. The RF amplifier circuit of claim 3, wherein the amplifier device further includes a second input configured to receive a second signal to be amplified and a second output configured to output a second amplified signal.

20. The RF amplifier circuit of claim 19, further comprising a power divider including an input and first and second outputs, the power divider configured to divide the power of an input signal received at the input into the first signal and the second signal.

* * * * *